(12) United States Patent
Lin (10) Patent No.: US 9,474,175 B2
(45) Date of Patent: Oct. 18, 2016

(54) FIXING DEVICE AND ELECTRONIC APPARATUS WITH THE FIXING DEVICE

(71) Applicant: ShenZhen Treasure City Technology Co., LTD., ShenZhen (CN)

(72) Inventor: Chieh-Hsiang Lin, New Taipei (TW)

(73) Assignee: ShenZhen Treasure City Technology Co., LTD., Shenzhen (CN)

( * ) Notice: Subject to any disclaimer, the term of this patent is extended or adjusted under 35 U.S.C. 154(b) by 0 days.

(21) Appl. No.: 14/691,149

(22) Filed: Apr. 20, 2015

(65) Prior Publication Data

US 2016/0219731 A1      Jul. 28, 2016

(30) Foreign Application Priority Data

Jan. 23, 2015 (CN) .......................... 2015 1 0034421

(51) Int. Cl.
*H05K 5/00* (2006.01)
*H05K 5/02* (2006.01)
*H05K 7/18* (2006.01)

(52) U.S. Cl.
CPC .............. *H05K 5/0217* (2013.01); *H05K 7/18* (2013.01)

(58) Field of Classification Search
CPC ... G06F 1/162; G06F 1/1679; H05K 9/0001; H05K 5/0217; H05K 7/18

USPC ................. 361/679.32–679.39, 724–727
See application file for complete search history.

(56) References Cited

U.S. PATENT DOCUMENTS 8,109,022 B2 *   2/2012  Wu ................... H04N 1/00347
                                                          248/469

* cited by examiner

*Primary Examiner* — Anthony Haughton
*Assistant Examiner* — Ingrid Wright
(74) *Attorney, Agent, or Firm* — Zhigang Ma (57) ABSTRACT

An electronic apparatus includes a rack, a chassis slidably moved into the rack, and a fixing assembly. A positioning hole is defined near a front edge of the rack. The fixing assembly includes a fixing device fixed on a front wall of the chassis, a pushing member rotatably coupled with a lower portion of the front wall, and a threaded member. The pushing member includes a pushing tip capable of extending into the positioning hole. A rotary member and a sliding member are assembled in the fixing device; an elastic member is disposed between the fixing device and the sliding member. The rotary member defines a threaded hole; the threaded member extends through the pushing member to engage in the threaded hole. A number of teeth extend from a periphery of the rotary member, a bulge of the sliding member and is capable of insetting between two adjacent teeth.

16 Claims, 8 Drawing Sheets

FIXING DEVICE AND ELECTRONIC APPARATUS WITH THE FIXING DEVICE

FIELD

The subject matter herein generally relates to a fixing device and an electronic apparatus with the fixing device.

BACKGROUND

An electronic device is slidably moved into a rack to allow connectors of the electronic device and the rack to be coupled. However, the connectors can be loose or over tightened which can lead to damage.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series and the like.

The present disclosure is described in relation to a fixing device and an electronic apparatus with the fixing device.

Figure 1:
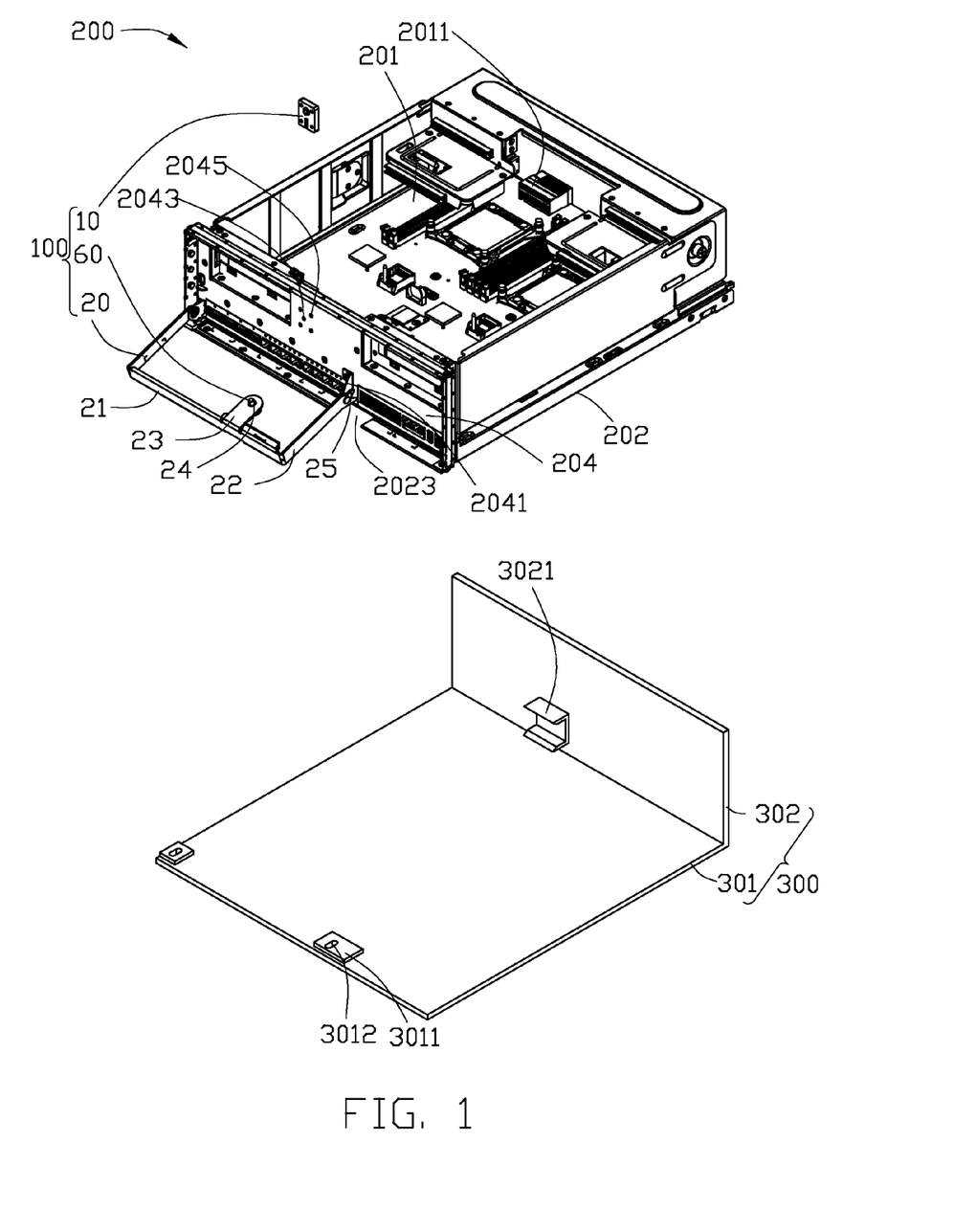
FIG. 1 is an exploded, isometric view of an embodiment of an electronic apparatus.

FIG. 1 illustrates an embodiment of an electronic apparatus. The electronic apparatus comprises a rack 300, a chassis 200, and a fixing assembly 100.

The rack 300 comprises a base board 301 and an end board 302 perpendicularly extending from a rear edge of the base board 301. Two positioning blocks 3011 are formed on the base board 301 adjacent to a front edge of the base board 301. Each positioning block 3011 defines an elongated positioning hole 3012 extending along a direction perpendicular to the end board 302. A connector 3021 is disposed on an inner surface of the end board 302.

The chassis 200 comprises a base wall 202, and a front wall 204 extending perpendicularly from the base wall 202 near a front edge of the base wall 202. A mother board 201 is attached to the base wall 202. A connector 2011 is disposed on the mother board 201, near a rear edge of the base wall 202. Two tabs 2041 extend outward from a lower portion of the front wall 204, near the base wall 202. Two notches 2023 are defined in the base wall 202, corresponding to the tabs 2041. A through hole 2043 is defined in an upper portion of the front wall 204, located between the two tabs 2041. A plurality of mounting holes 2045 are defined in the front board 204, around the through hole 2043.

The fixing assembly 100 comprises a fixing device 10, a pushing member 20, and a threaded member 60. In this embodiment, the threaded member 60 can be a screw.

Figure 2:
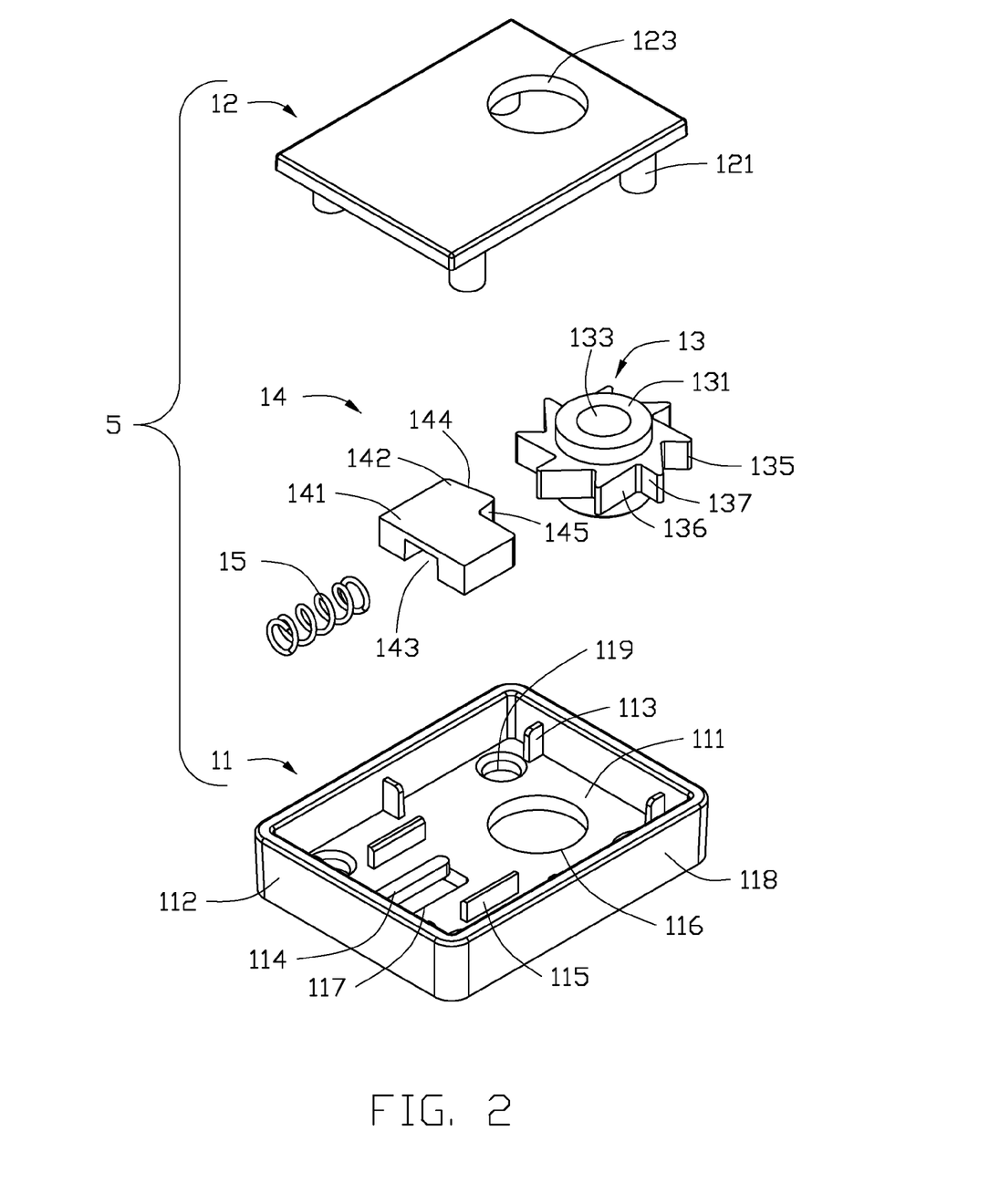
FIG. 2 is an exploded, isometric view of an embodiment of a fixing device.

FIG. 2 illustrates an embodiment of the fixing device 10. The fixing device 10 comprises a container 5, a rotary member 13, a sliding member 14, and an elastic member 15. In this embodiment, the elastic member 15 can be a spring.

The container 5 comprises a base 11 and a cover 12. The base 11 comprises a bottom plate 111, two side plates 118 perpendicularly extending up from two opposite side edges of the base plate 111, and two end plates 112 perpendicularly extending up from two opposite end edges of the base plate 111. A plurality of pillars 113 extends perpendicularly from the base plate 111 and abuts against the end plates 112 or the side plates 118. A positioning post 114 extends inward from an inner surface of one of the end plates 112. A rectangular opening 117 is defined in the base plate 111, corresponding to the positioning post 114. A through hole 116 is defined in the base plate 111, away from the positioning post 114. Two guiding sheets 115 extend from the base plate 111, respectively located beside the opening 117. A through hole 119 is defined in each corner of the base plate 111.

The cover 12 is a rectangular plate. A fixing post 121 extends down from each corner of the cover 12. A through hole 123 is defined in the cover 12. A threaded hole is axially defined in each fixing post 121.

The rotary member 13 comprises a shaft 131, and a plurality of teeth 135 evenly extending from a periphery of the shaft 131. The shaft 131 axially defines a threaded hole 133. In this embodiment, each tooth 135 has a right triangle cross section and comprises a hypotenuse wall 136 and a leg wall 137.

The sliding member 14 comprises a rectangular main body 141 and a bulge 142 protruding from an end of the main body 141. The bulge 142 comprises a blocking wall 145 perpendicular to a first end wall of the main body 141 and a slantingly guiding wall 144 angled with the blocking wall 145 and connecting with a sidewall of the main body 141. A receiving groove 143 extends through a bottom wall of the main body 141 and a second end wall of the main body 141 opposite to the first end wall.

The pushing member 20 is U-shaped and comprises a first bar 21 and a pair of second bars 22 extending perpendicularly from two opposite ends of the first bar 21. The second bars 22 are rotatably attached to the tabs 2041 of the chassis 20. A fixing strip 23 extends from the first bar 21 in a direction same as the second bars 22. A through hole 24 is defined in the fixing strip 23. A V-shaped pushing tip 25 is formed at a distal end of each second bar 22.

Figure 3:
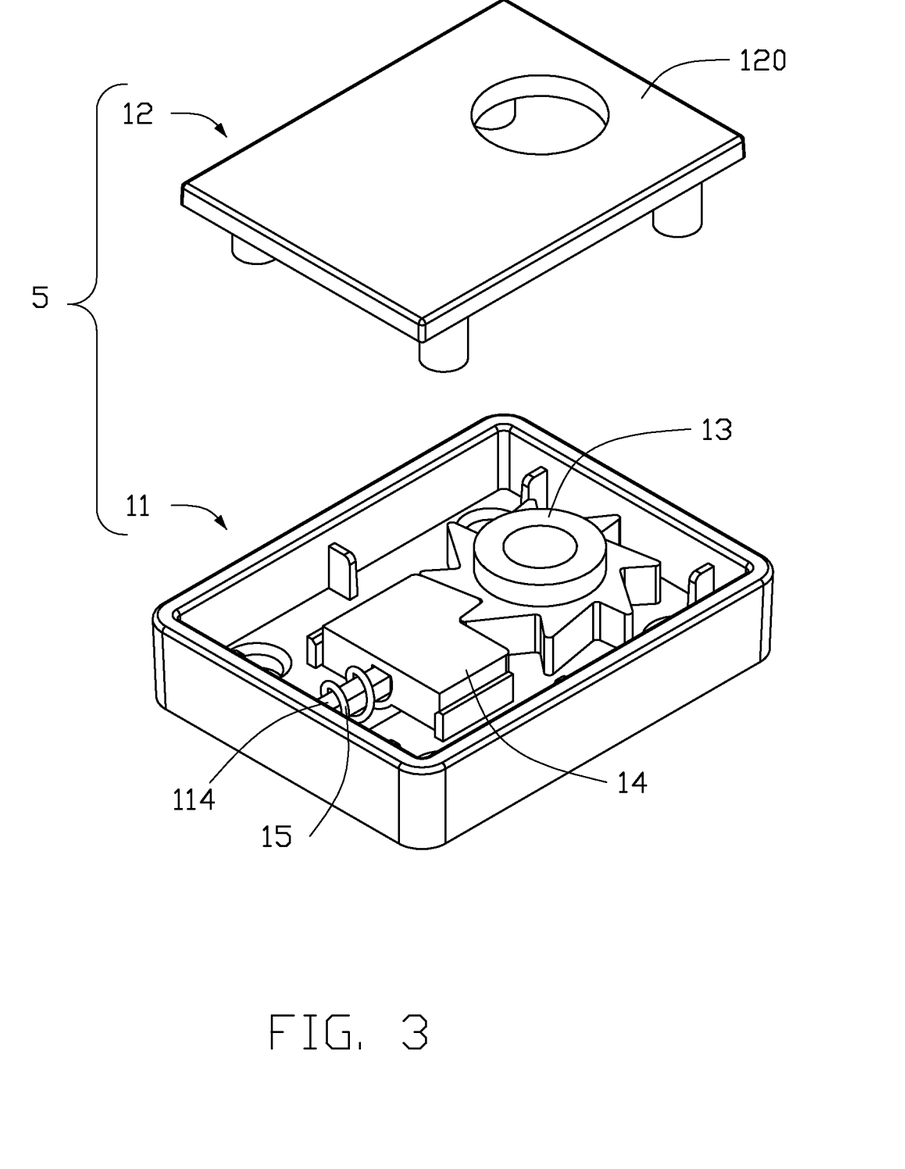
FIG. 3 is a partially assembled, isometric view of FIG. 2.

FIG. 3 illustrates a partially assembled fixing device 10. In assembly of the fixing device 10, the elastic member 15 is fixed around the positioning post 114. The sliding member 14 is slidably arranged between the two guiding sheets 115. The positioning post 114 and the elastic member 15 can be received in the receiving groove 143 of the sliding member 14. Two ends of the elastic member 14 respectively abut against the sliding member 14 and the corresponding end plate 112. The rotary member 13 is rotatably received in the base 11, with one end of the shaft 131 extending through the through hole 116. The bulge 142 of the sliding member 14 extends retractably between two adjacent teeth 135. The slanting wall 144 abuts against the hypotenuse wall 136 of one of the tooth 135 and the blocking wall 145 abuts against the leg 137 wall of the corresponding tooth 135. The cover 12 is attached to the base 11. The fixing posts 121 of the cover 12 align with the through holes 119 and the cover 12 is supported on the pillars 113. The other end of the shaft 131 of the rotary member 13 extends through the through hole 123.

Figure 4:
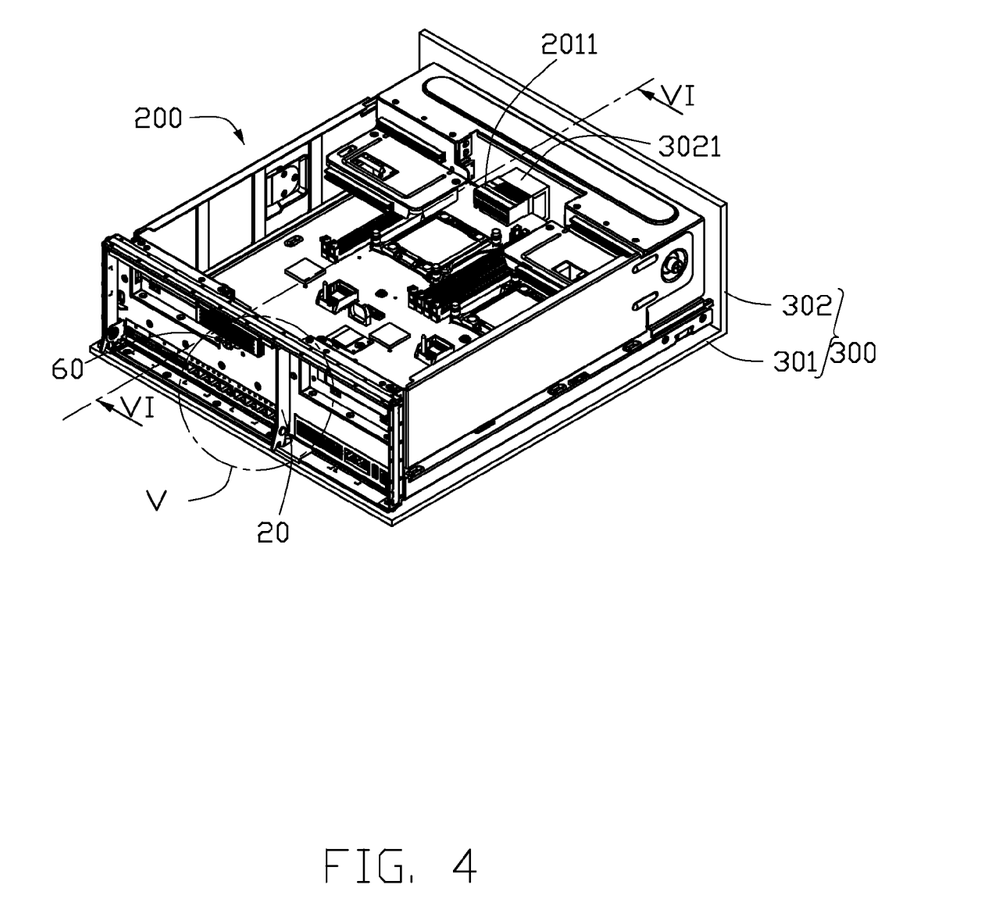
FIG. 4 is an assembled, isometric view of FIG. 1.
Figure 5:
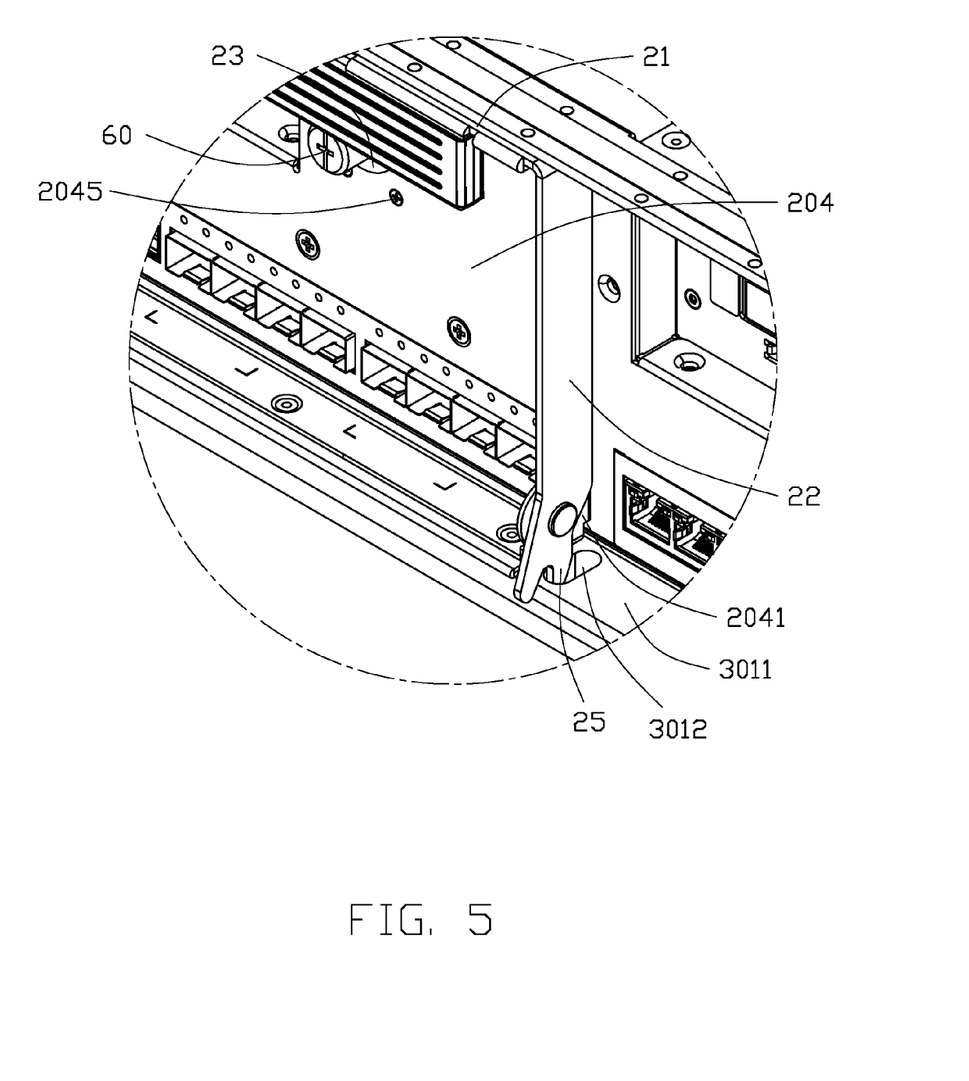
FIG. 5 is an enlarged view of portion V of FIG. 4.
Figure 6:
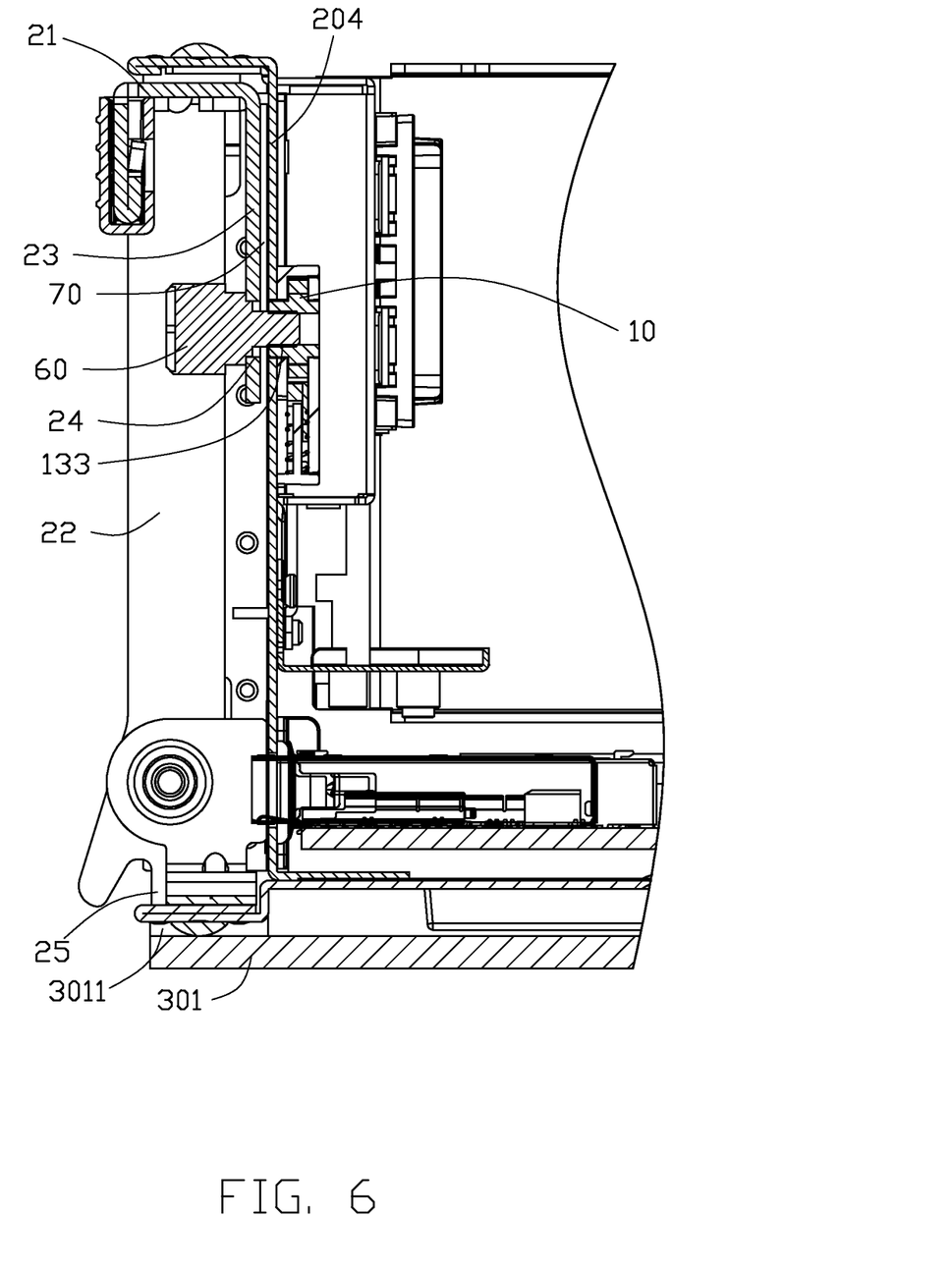
FIG. 6 is a cross sectional view taken along line VI-VI of FIG. 4.

FIGS. 4-6 illustrate that the electronic apparatus is assembled. The fixing device 10 is attached to the front wall 204 of the chassis 200. The base plate 111 of the base 11 abuts against inner surface of the front wall 204. The threaded hole 133 of the rotary member 13 aligns with the through hole 2043 of the front wall 204. The through holes 119 of the base 11 align with the mounting holes 2045 of the front wall 204. A plurality of screws extends through the mounting holes 2045 to engage in the threaded holes of the fixing posts 121.

The chassis 200 is slid into the rack 300 from front to rear. The base board 301 of the rack 300 supports the base wall 202 of the chassis 200. The connector 2011 of the chassis 200 can be inserted in the connector 3021 of the rack 300. The two positioning blocks 3011 can be received in the corresponding notches 2023. Rotating the pushing member 20 toward the front wall 204 allowing the fixing strip 23 to abut the front wall 204. The pushing tips 25 extend into the positioning holes 3012 and abut against front inner surfaces of the positioning holes 3012. The through hole 24 of the pushing member 20 aligns with the through hole 2043 of the front wall 204. The threaded member 60 can extend through the through hole 24 and the through hole 2043 to engage in the threaded hole 133 of the fixing device 10. A gap 70 (shown in FIG. 6) is defined between the fixing strip 23 and the front wall 204.

Figure 7:
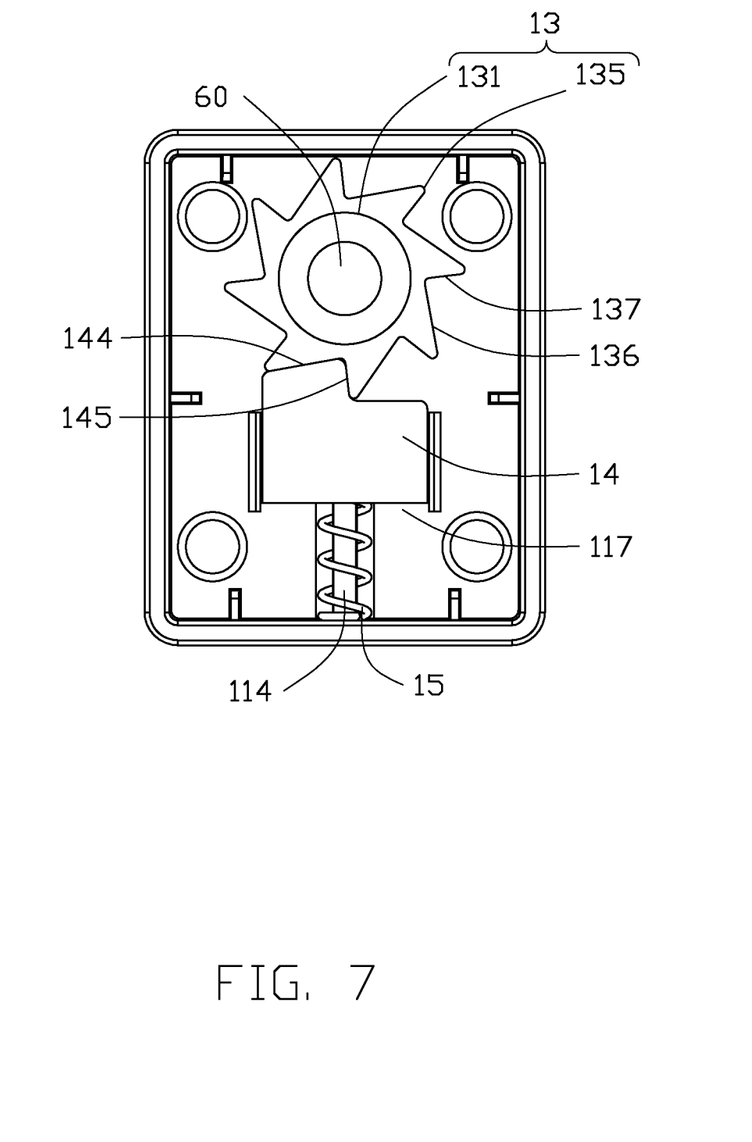
FIGS. 7 and 8 are two plane views of the fixing device in use.
Figure 8:
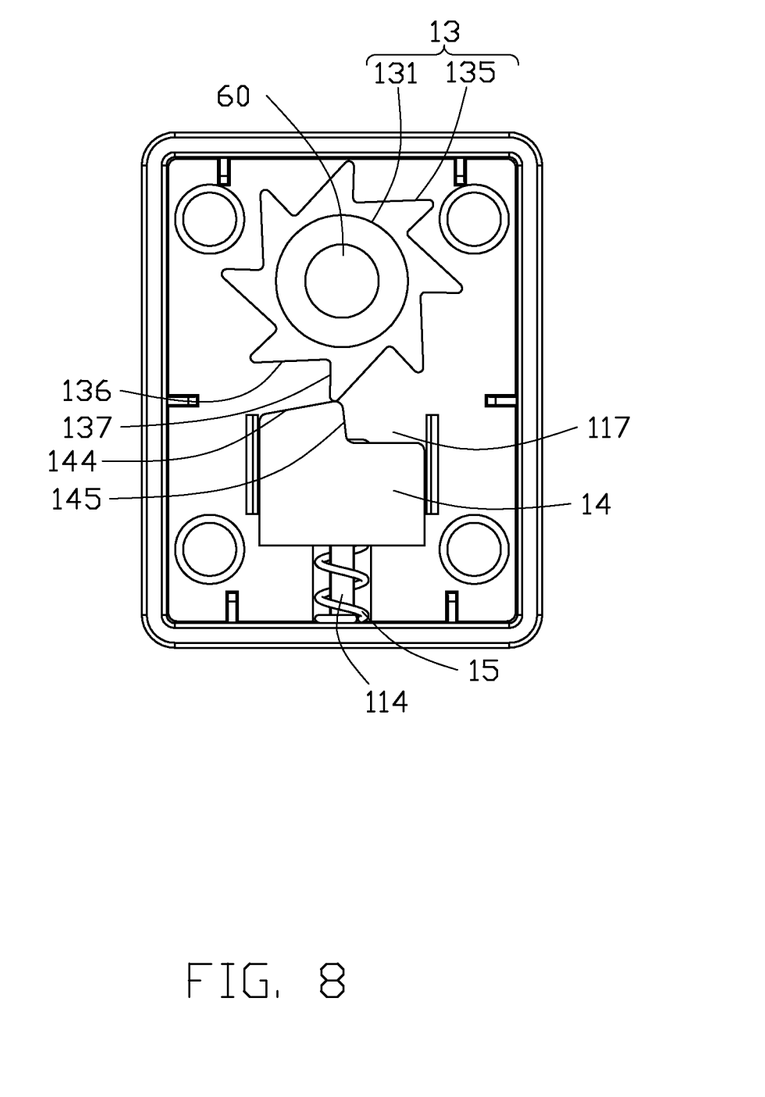

FIGS. 7 and 8 illustrate the fixing device 10 in use. The threaded member 60 can engage in the threaded hole 133 of the rotary member 13 to reduce the gap 70 between the fixing strip 23 and the front wall 204. Top portions of the second bars 22 can be moved to close the front wall 204 and the pushing tips 25 can be moved to abut against the front inner surfaces of the positioning holes 3012. Then, the chassis 200 can be slid toward the end board 302 and the connector 2011 can be coupled with the connector 3021. Two adjacent teeth 135 are blocked by the bulge 142, the rotary member 13 is not rotated with the threaded member 60 until the connector 2011 is tightly coupled with the connector 3021.

With the further rotation of the threaded member 60, the two adjacent teeth 135 urge the bugle 142 to slide the sliding member 14 away from the rotary member 13 and the elastic member 15 is deformed. The two adjacent teeth 135 depart from the bulge 142 and the rotary member 13 can rotate together with the threaded member 60. The threaded member 60 will not be further screwed to engage in the threaded hole 133, the connector 3021 of the rack 300 will not be damaged by the connector 2011 of the chassis 200.

In another embodiment, the base 11 is coupled with the front wall 204 and the cover 12 is fastened on the base 11.

The embodiments shown and described above are only examples. Many details are well known by those in the art therefore many such details are neither shown nor described. Even though numerous characteristics and advantages of the present technology have been set forth in the foregoing description, together with details of the structure and function of the present disclosure, the disclosure is illustrative only, and changes may be made in the details, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A fixing device comprising:
   a container;
   a rotary member rotatably received in the container and comprising a shaft, and a plurality of teeth extending from a periphery of the shaft;
   a sliding member slidably received in the container and comprising a bulge slidably extending between two adjacent teeth; and
   an elastic member disposed between the sliding member and the container.

2. The fixing device of claim 1, wherein the sliding member comprises a main body, the bulge protrudes from an end wall of the main body.

3. The fixing device of claim 2, wherein each tooth is with a right angle cross section and comprises a hypotenuse wall and a leg wall, the bulge comprises a blocking wall perpendicular to the end wall of the main body and a slantingly guiding wall angled with the blocking wall, the guiding wall engage with the hypotenuse wall of the corresponding tooth and the blocking wall engages with the leg wall of the corresponding tooth.

4. The fixing device of claim 2, wherein the sliding member comprises a receiving groove extending through an end wall of the main body away from the bulge, the container further comprises a positioning post capable of extending into the receiving groove, the elastic member is fixed around the positioning post, two opposite ends of the elastic member respectively abut against the main body and the container.

5. The fixing device of claim 4, wherein the container further comprises two guiding sheets respectively formed beside the positioning post, the sliding member is capable of sliding between the two guiding sheets.

6. The fixing device of claim 1, wherein the shaft of the rotary member axially defines a threaded hole.

7. The fixing device of claim 1, wherein the container comprises a base, and a cover covering the base.

8. The fixing device of claim 7, wherein a plurality of pillars extends from the base to support the cover.

9. An electronic apparatus comprising:
   a rack comprising a base board and an end board perpendicularly formed at a rear edge of the base board, a positioning hole defined in the base board, a connector formed at the end board;
   a chassis slidably moved into the rack and comprising a base wall with a connector, and a front wall perpendicular formed near a front edge of the base wall;

a fixing device attached to the front wall of the chassis and comprising a container, a rotary member rotatably mounted in the container, a sliding member slidably mounted in the container, an elastic member disposed between the sliding member and the container, the rotary member comprising a shaft, and a plurality of teeth extending from a periphery of the shaft, the sliding member comprising a bulge retractably extending into two adjacent teeth, the shaft comprising a threaded hole axially defined therein;

a pushing member rotatably coupled with a lower portion of the front wall and comprising a pushing tip capable of extending into the positioning hole, and a threaded member capable of extending through the pushing member and the front wall to engage in the threaded hole of the rotary member to allow the connectors of the chassis and rack to be coupled tightly.

10. The electronic apparatus of claim 9, wherein he sliding member comprises a main body, the bulge protrudes from an end wall of the main body.

11. The electronic apparatus of claim 10, wherein each tooth is with a right angle cross section and comprises a hypotenuse wall and a leg wall, the bulge comprises a blocking wall perpendicular to the end wall of the main body and a slantingly guiding wall angled with the blocking wall, the guiding wall engage with the hypotenuse wall of the corresponding tooth and the blocking wall engages with the leg wall of the corresponding tooth.

12. The electronic apparatus of claim 10, wherein the sliding member comprises a receiving groove extending through an end wall of the main body away from the bulge, the container further comprises a positioning post capable of extending into the receiving groove, the elastic member is fixed around the positioning post, two opposite ends of the elastic member respectively abut against the main body and the container.

13. The electronic apparatus of claim 10, wherein the pushing member is U-shaped and comprises a first bar and a pair of second bars extending perpendicularly from two opposite ends of the first bar, two tabs extend outward from a lower portion of the end wall to rotatably engage with the two second bars.

14. The electronic apparatus of claim 13, wherein a fixing strip extends from the first bar in a direction same as the second bars, the threaded member extends through the fixing strip and the end wall to engage in the threaded hole of the rotary member.

15. The electronic apparatus of claim 13, wherein the pushing tip is formed at a distal end of one of the second bars, another positioning hole is defined in the base board, another pushing tip formed at a distal end of another second bar is capable of extending into the other positioning hole.

16. A screw lock mechanism comprising:

a container having a defined substantially enclosed space;

a rotary member rotatably mounted within the defined space, the rotary member having a shaft threadably engageable with a threaded member inserted into the defined space, and a plurality of teeth extending from a periphery of the shaft;

a sliding member slidably received within the defined space and movable in a direction substantially perpendicular to an axis of the rotary member, the sliding member having a bulge portion selectively engagable between two of the plurality of rotary member teeth; and an elastic member positioned within the defined space and urging the sliding member towards the rotary member;

wherein, when a threaded member is engaged with the rotary member and rotated in a first rotation direction, the rotary member rotates with at least one of the plurality of teeth forcing the bulge portion of the sliding member to disengage from between a first set of two rotary member teeth and the elastic member urges the sliding member toward the rotary member forcing the bulge portion to re-engage with a second set of two rotary member teeth once the threaded is no longer being rotated; and wherein, when engaged with rotary member the bulge portion of the sliding member abuts at least one of the plurality of teeth to resist rotation of the rotary member, and the threaded member, in a second rotation direction opposite to the first rotation direction.

* * * * *